United States Patent [19]

Sato

[11] Patent Number: 5,594,688
[45] Date of Patent: Jan. 14, 1997

[54] NONVOLATILE SEMICONDUCTOR MEMORY DEVICE AND METHOD OF PRODUCING THE SAME

[75] Inventor: Yasuo Sato, Tokyo, Japan

[73] Assignee: Nippon Steel Corporation, Tokyo, Japan

[21] Appl. No.: 499,379

[22] Filed: Jul. 7, 1995

[30] Foreign Application Priority Data

Jul. 8, 1994 [JP] Japan .................................. 6-180697

[51] Int. Cl.$^6$ .................................................. H01L 29/788
[52] U.S. Cl. .............................. 365/185.1; 365/185.01; 365/185.16; 327/315; 327/316; 327/318
[58] Field of Search ......................... 365/185.01, 185.16, 365/185.2, 185.1; 327/314, 315, 316, 317, 318, 320

[56] References Cited

U.S. PATENT DOCUMENTS 4,495,693  1/1985  Iwahashi et al. ...................... 257/316

FOREIGN PATENT DOCUMENTS 0272672  3/1990  Japan .
3285359  12/1991  Japan .
5206472  8/1993  Japan .

OTHER PUBLICATIONS

Kynett et al., "An In-System Reprogrammable 32K×8 CMOS Flash Memory", IEEE Journal of Solid State Circuits, vol. 23, No. 5, Oct. 1988 pp. 1157–1163.

Kume et al., "A 1.28μm$^2$ Contactless Memory Cell Technology for a 3V Only 64M bit EEPROM", IEDM 92-991 pp. 24.7.1–24.7.3.

Primary Examiner—David C. Nelms
Assistant Examiner—Vu A. Le
Attorney, Agent, or Firm—Pollock, Vande Sande & Priddy

[57] ABSTRACT

A nonvolatile semiconductor memory device has a semiconductor substrate of a first conductivity type, at least a pair of element isolation insulating films and a pair of spaced source/drawn regions of a second conductivity type different from the first conductivity type and formed in a surface of the semiconductor substrate. A floating gate electrode is formed above a channel region disposed between the pair of source/drain regions in the surface of the semiconductor substrate in an insulated relationship with the channel region. The floating gate electrode overlaps each of the element isolation insulating films and a gap is formed between an underside of the floating gate electrode and each of the element isolation insulating films at each of portions thereof where the floating gate electrode overlaps the pair of element isolation insulating films, respectively. A control gate electrode is formed above the floating gate electrode in an insulated relationship with the floating gate electrode. A part of the control gate electrode extends beyond a side of the floating gate electrode to an underside of the floating gate electrode facing each of the gaps.

11 Claims, 7 Drawing Sheets

NONVOLATILE SEMICONDUCTOR MEMORY DEVICE AND METHOD OF PRODUCING THE SAME

BACKGROUND OF THE INVENTION

1. Field of the Invention

This invention relates to nonvolatile semiconductor memory devices and to methods of producing the same. In particular, it relates to a nonvolatile semiconductor memory device which is electrically rewritable and has floating gate type memory cells, and to a method of producing the same.

2. Description of the Related Art

As examples of nonvolatile semiconductor memory devices which can electrically write and erase data, there are known EEPROM (Electrically Erasable Programmable Read Only Memory) and a flash memory, as disclosed in, for example, "An In-System Reprogrammable 32 Kx8 CMOS Flash Memory" V. N. Kynett, et al., IEEE Journal of Solid-State Circuits Vol. 23, No. 5, October, 1988, p.p. 1157–1163.

As the flash memories are used mainly in portable equipment, it is important to apply a low power source voltage and speed up the rewriting operation.

In order to lower the voltage applied to the control gate electrode and to increase the rewriting speed, it is necessary to increase the capacitance between the control gate electrode and the floating gate electrode. Hence, it is effective to widen the area of the overlap region of the control gate electrode and the floating gate electrode. The structure of this type is disclosed in, for example, "A 1.28 $\mu m^2$ Contactless Memory Cell Technology for a 3 V-only 64 Mbit EEPROM", H. Kume et al., IEDM 92, 1992, p.p. 991–993

However, in order to increase the area of the overlap region of the control gate electrode and the floating gate electrode, it is necessary to increase the area of the element isolating film, which results in the increase of the memory cell size.

SUMMARY OF THE INVENTION

It is an object of the present invention to provide a nonvolatile semiconductor memory device in which the overlap area of the control gate electrode and the floating gate electrode is increased without increasing the area of the memory cell, and a method of producing the same.

A nonvolatile semiconductor memory device according to this invention includes a semiconductor substrate of a first conductivity type, a pair of spaced source/drain regions of a second conductivity type different from the first conductivity type and formed on a surface of the substrate, a floating gate electrode formed above a channel region disposed between the pair of source/drain regions in the surface of the semiconductor substrate in an insulated relationship with the channel region, and a control gate electrode formed on the floating gate electrode in an insulated relationship with the floating gate electrode wherein a part of the control gate electrode extends beyond a side of the floating gate electrode to an underside thereof.

A method of producing the nonvolatile semiconductor memory device according to this invention includes the steps of selectively forming element isolation insulating films on a surface of a semiconductor substrate, forming a first polycrystalline silicon film on the surface of the semiconductor substrate, selectively etching the first polycrystalline silicon film to thereby partially expose the element isolation insulating films. The steps further include partially etching each of the element isolation insulating films by using the first polycrystalline silicon film as a mask to form a gap between each of the element isolation insulating films and the first polycrystalline silicon film, successively forming an interlayer insulating film and a second polycrystalline silicon film over an entire surface of the semiconductor substrate, and selectively etching a composite layer including the first polycrystalline silicon film, the interlayer insulating film and the second polycrystalline silicon film to form a predetermined pattern of the composite layer.

In the nonvolatile semiconductor memory device of the invention, since the control gate electrode is formed to extend under the floating gate electrode with an insulating film interposed therebetween, the area of the overlap of the control gate electrode and the floating gate electrode can be increased without necessity to the area of the memory cell.

Moreover, according to the method of producing the nonvolatile semiconductor memory device of the invention, since a gap or cavity is formed by etching the element isolation insulating film by using, as a mask, the first polycrystalline silicon film, which is used to form the floating gate electrode, and the second polycrystalline silicon film of the control gate electrode is formed to extend into the cavity with an interlayer insulating film disposed therebetween, the area of the overlap of the control gate electrode and the floating gate electrode can be widened almost without increasing the number of processing steps.

DESCRIPTION OF THE PREFERRED EMBODIMENTS

The nonvolatile semiconductor memory device of the first embodiment of the present invention will be described with reference to FIGS. 1A, 1B and 2.

Figure 1A:
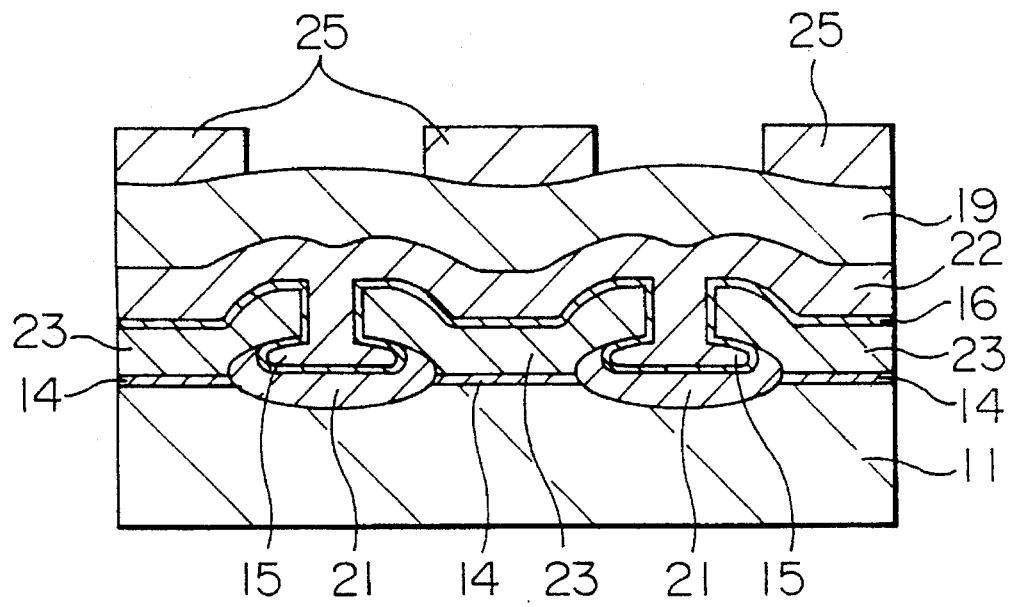
FIGS. 1A and 1B are cross-sectional views of the memory cells of a nonvolatile semiconductor memory device of the first embodiment according to this invention, taken along lines 1A—1A and 1B—1B, respectively, in FIG. 2.
Figure 1B:
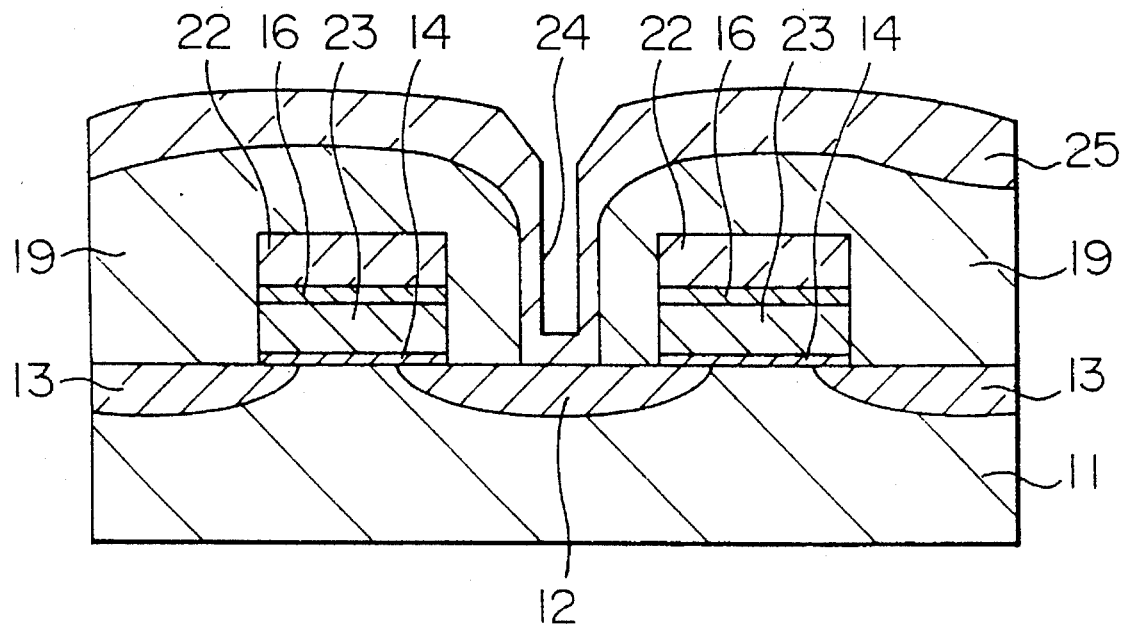
Figure 2:
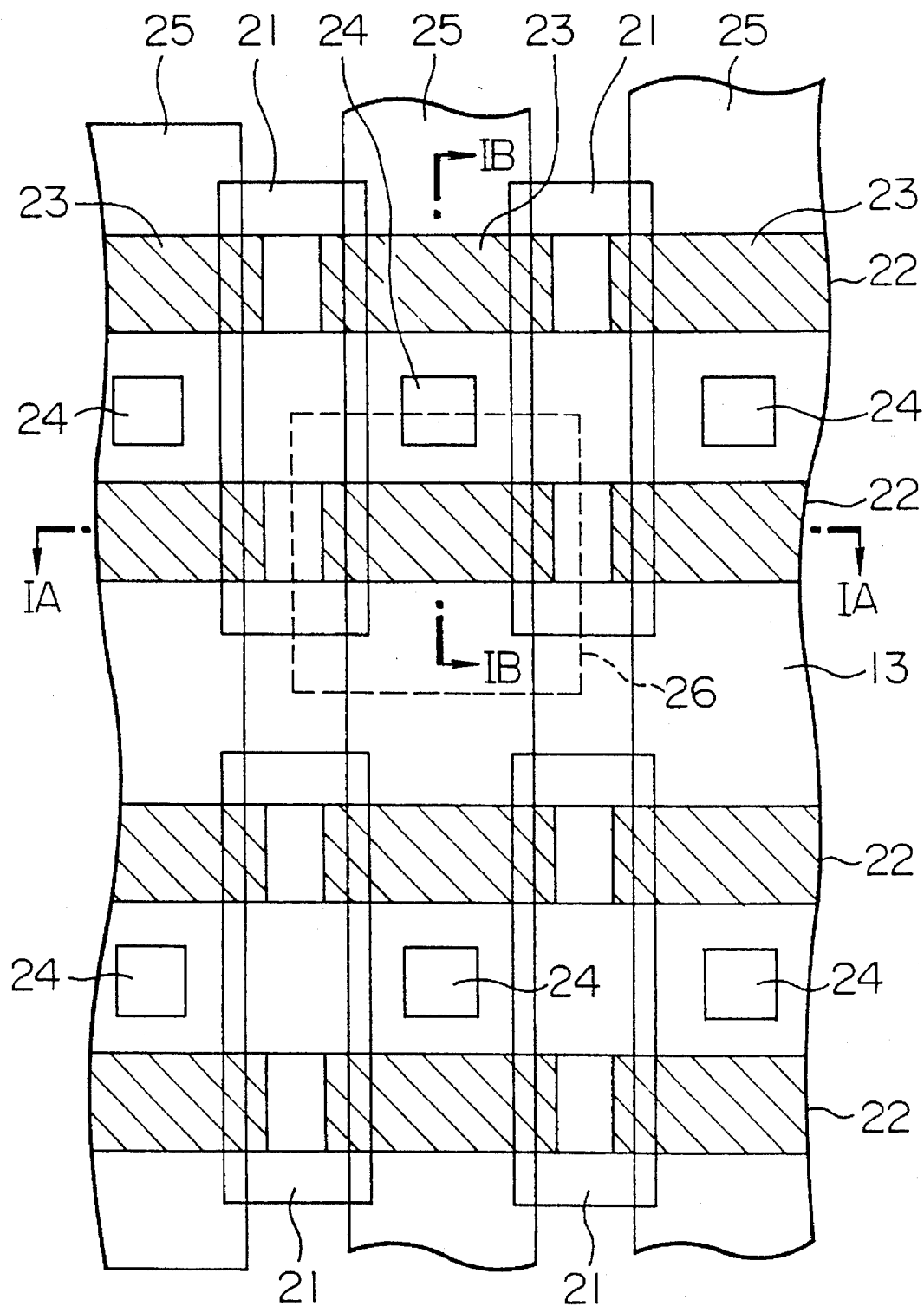
FIG. 2 is a plan view of the memory cell arrangement of the nonvolatile semiconductor memory device of the first embodiment according to this invention.

FIG. 1A is a cross-sectional views taken along the line IA—IA in FIG. 2, and FIG. 1B is a cross-sectional view taken along the line IB—IB in FIG. 2. FIG. 2 is a plan view of the memory cell arrangement according to the first embodiment of the invention.

As shown in FIG. 1A, silicon oxide films, or element isolating films 21 of, for example, about 3000 to 6000 Å in thickness are formed on the P-type silicon substrate 11 by the LOCOS method so that the element regions formed between the element isolating films 21 are electrically separated from each other.

In each of the channel regions formed in the element regions and isolated from each other by the element isolating films 21, there is formed by heat oxidization a silicon oxide film, or tunnel oxide film 14 of, for example, about 50 to 130 Å in thickness. A conductive polycrystalline silicon film of the floating gate electrode 23 is formed on the tunnel oxide film 14 so as to bridge over the two adjacent element isolating films 21 and provide a gap region 15 between the floating gate electrode 14 and each of the element isolating films 21. The gap region 15 has a width a of 0.1–0.3 μm at a widest portion of its entrance (see FIG. 5B) and a depth b of 0.2–0.5 μm.

In addition, an interlayer insulating film or an ONO insulating film 16 made of, for example, silicon oxide film/silicon nitride film/silicon oxide film is deposited at a thickness of for example, about 300 Å converted to an equivalent oxide film thickness on upper and side surfaces of the floating gate electrode 23 and on the surfaces of the gap regions 15. Further, a conductive polycrystalline silicon film of a control gate electrode 22 is formed to cover the floating gate electrode and extends to fill the gap regions 15, while insulated from the floating gate electrode by the interlayer insulating film 16. That is, parts of the control gate 22 and the interlayer insulating film 16 extend beyond the sides of the floating gate electrode 23 to the under sides thereof exposed to the gap regions 15.

Another interlayer insulating film 19 is deposited over the control gate electrode 22 and then the metal wiring layers 25 are formed on the interlayer insulating film 19.

As shown in FIG. 1B which is taken along the line IB—IB in FIG. 2, the N-type drain diffusion layer 12 and source diffusion layer 13 are formed in the surface of the P-type silicon substrate 11 so as to partially overlap the opposite sides of each floating gate electrode 23. The drain diffusion layer 12 is common to the two adjacent floating gate electrodes 23. The drain diffusion layer 12 and the source diffusion layer 13 are formed by doping in the substrate an impurity material of arsenic at a surface concentration of $1 \times 10^{18}$ to $1 \times 10^{21}$ cm$^{-3}$.

In addition, the drain diffusion layer 12 is connected through a contact hole 24 to the metal wiring layer 25, and the source diffusion layer 13 is also connected to a metal wiring layers (not shown).

The operation of the nonvolatile semiconductor memory device according to the first embodiment of the invention will be described with reference to FIG. 3.

Figure 3:
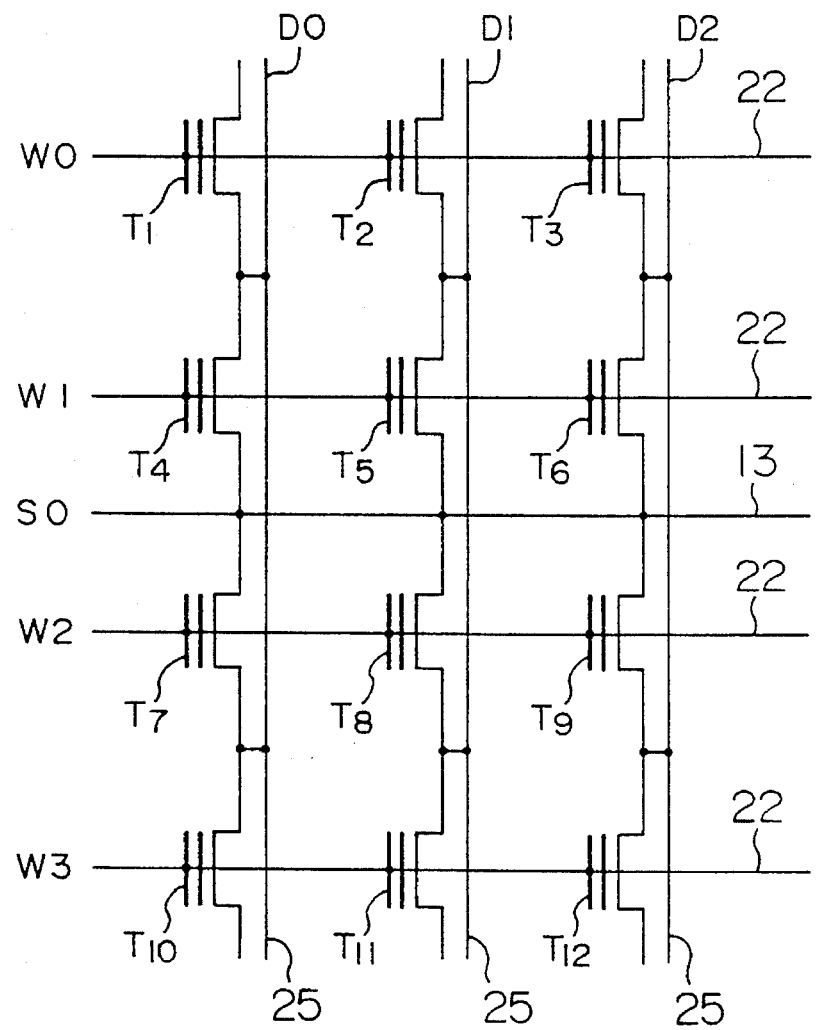
FIG. 3 is a circuit diagram of the nonvolatile semiconductor memory device of the first embodiment according to this invention.
Figure 4:
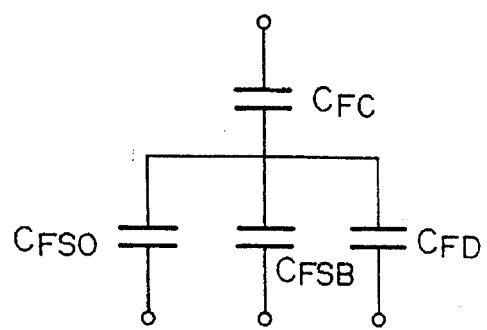
FIG. 4 is an equivalent circuit diagram showing the electric characteristics of each memory cell.

FIG. 3 is an equivalent circuit diagram of the nonvolatile semiconductor memory device according to the first embodiment of the invention.

In the writing mode, if a memory cell transistor T5 is selected, a decoder (not shown) supplies, for example, a voltage of 6 V to a bit line D1, 0 V to bit lines D0, D2, 0 V to a source line S0, 10 V to a word line W1 and 0 V to word lines W0, W2, W3. Consequently, a voltage of 6 V is applied to the drain diffusion layer 12 (D$_1$) of the memory cell transistor T5, 0 V to its source diffusion layer 13 (S0), and 10 V to its control gate electrode 22 (W1).

Therefore, a current flows through the channel region of the memory cell transistor T5. Thus, the electrons accelerated by an electric field in the pinch-off region, which is generated in the channel region near the drain diffusion layer 12 (D1), are injected as hot electrons beyond the energy barrier of the tunnel oxide film 14 into the floating gate electrode 23.

Since the injected electrons are held within the floating gate electrode 23 which is in an electrically floating state, the threshold voltage of the memory cell transistor T5 is increased from the initial state of about 2 V to about 7 V for instance, thus performing the writing mode operation.

In the erasing mode, a decoder (not shown) operates to render the bit lines D0 to D2 in open state and to supply a voltage of 12 V to the source line S0 and a voltage of 0 V to the word lines W1 to W3. Thus, the drain diffusion layer 12 of each of the memory cell transistors T$_4$ to T$_9$ is in the floating state, and a voltage of 12 V is applied to its source diffusion layer 13 and 0 V to its control gate electrode 22 (W1 or W2).

Therefore, the electrons within the floating gate electrode 23 of each of T$_4$ to T$_9$ are drawn out into its source diffusion layer 13 through the tunnel oxide film 14 by FN tunneling. The threshold voltage of each of the transistors T4 to T9 is decreased, for example, from about 7 V to about 2 V, thus sector erasing being performed.

In the reading mode, if the memory cell transistor T5 is selected, a decoder (not shown) operates to supply a voltage of 1 V to the bit line D1, 0 V to the bit line D0, D2, 0 V to the source line S0, 5 V to the word line W1, and 0 V to the word lines W0, W2, W3. Consequently, a voltage of 1 V is applied to the drain diffusion layer 12 (D1) of the memory cell transistor T5, 0 V to its source diffusion layer 13 (S0), and 5 V to its control gate electrode 22 (W1). Then, a sense amplifier (not shown) detects if a current flows through the memory cell transistor T5.

In this first embodiment, when the area of the memory cell 26 is the same as in the prior art, the voltage to be applied to the control gate electrode 22 in the writing mode can be decreased from about 12 V to about 10 V. Thus, it is possible to use a low voltage for operation as compared with the prior art.

In addition, if the voltage to be applied in the writing mode is equal to that in the prior art and if the value of the capacitance C$_{FC}$ between the control gate electrode 22 and the floating gate electrode 23 is the same as in the prior art, it is possible to reduce an amount of the overlap between the element isolating film 21 and the floating gate electrode 23, and thus the area of the memory cell 26 can be decreased.

When the memory cell 26 is made according to the design rule of about 0.8 μm, the area of the memory cell 26 is as large as about 10 μm$^2$ in the prior art, while the area of the memory cell 26 is about 8 μm$^2$ in the first embodiment, which is about 20% of the prior art, because an amount of the overlap between the element isolating film 21 and the floating gate electrode 23 can be reduced from about 1 μm to 0.7 μm.

Next, a method of producing the nonvolatile semiconductor memory device according to the first embodiment of the invention will be described with reference to FIGS. 5A to 5E.

FIGS. 5A to 5E show cross-sectional views at the respective steps in the method of producing the nonvolatile semiconductor memory device according to the first embodiment of the invention.

Figure 5A:
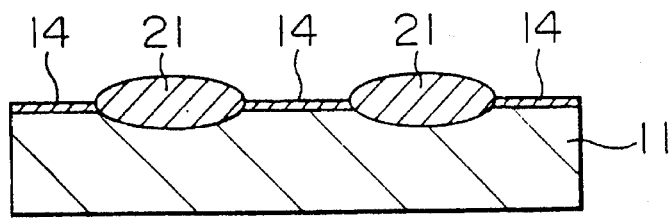
FIGS. 5A to 5E are cross-sectional views of the nonvolatile semiconductor memory device of the first embodiment according to this invention at the respective steps of a method of producing the same.

First, as shown in FIG. 5A, silicon oxide films, or element isolating films 21 are selectively formed at, for example, about 4000 to 9000 Å in thickness on the P-type silicon substrate 11 by the LOCOS method.

Then, after the surfaces of the element regions of the P-type silicon substrate 11 are exposed by wet etching, silicon oxide films, or tunnel oxide films 14 are formed thereon by heat oxidization at for example about 50 to 130 Å in thickness. Next, N type impurities are ion-injected into predetermined surface portions of the D-type silicon substrate thereby forming source regions 12 and drain regions 13.

Figure 5B:
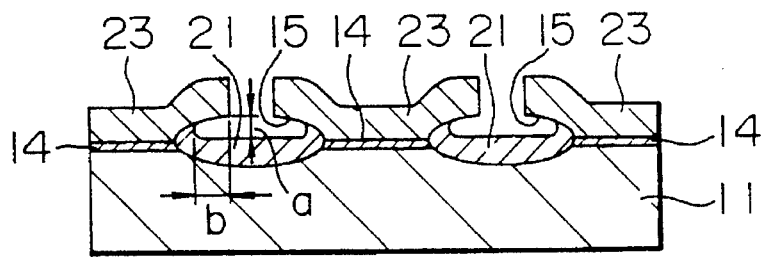

Thereafter, as shown in FIG. 5B, a conductive polycrystalline film is deposited at a thickness of about 1000 to 2000 Å over the substrate by the CVD method or the like. The polycrystalline silicon film is separated in a direction of IA—IA in FIG. 2 at positions on the element isolating films by photolithography and dry etching to leave stripe-like portions 23' extending in the direction of IB—IB which are used for forming the floating gates 23.

The element isolating films 21 are selectively wet-etched by use of a mask of the floating gate electrodes 23 to a depth of about 1000 to 3000 Å, thereby removing parts of the element isolating films 21 with which the strip-like portions 23' overlap so as to form the gap region 15 between each of the stripe-like portions and the associated element isolating film 21 with a width a of 0.1 to 0.3 μm at a widest portion of its entrance and a depth b of 0.2 to 0.5 μm.

This wet etching process serves as a cleaning process which is carried out, before the interlayer insulating film 16 is deposited over the floating gates, for removing heavy metal and foreign particles on the surfaces of the floating gate electrodes 23 by etching using hydrogen peroxide aqueous solution of ammonia and hydrofluoric acid aqueous solution process along with the process of etching part of the overlapped portions of the element isolating films 21. Thus, it is unnecessary to increase the number of steps any more, and this embodiment can be realized by only slightly modifying the process conditions.

For example, by extending the etching time on the cleaning process using hydrofluoric acid aqueous solution from generally one minute to about ten minutes or changing the concentration of about 0.1% of hydrofluoric acid aqueous solution to about 2%, it is possible to form the gap region 15 between each of the element isolating films 21 and the adjacent floating gate electrode 23.

Figure 5C:
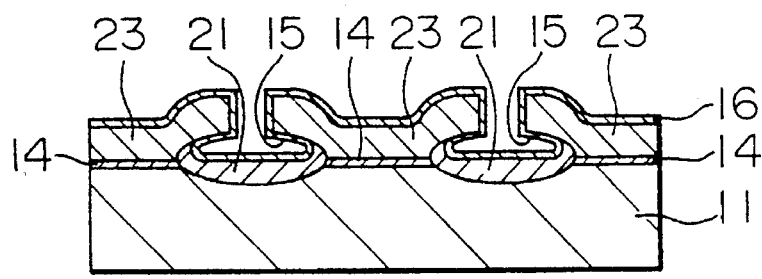

Then, as shown in FIG. 5C, the interlayer insulating film 16 or the ONO insulating film made of for example silicon oxide film/silicon nitride film/silicon oxide film is deposited at a thickness of about 300 Å converted into an equivalent oxide film thickness on upper and side surfaces of each stripe-like portion 23' and on the surface in each gap region 15 by CVD and thermal oxidation.

Figure 5D:
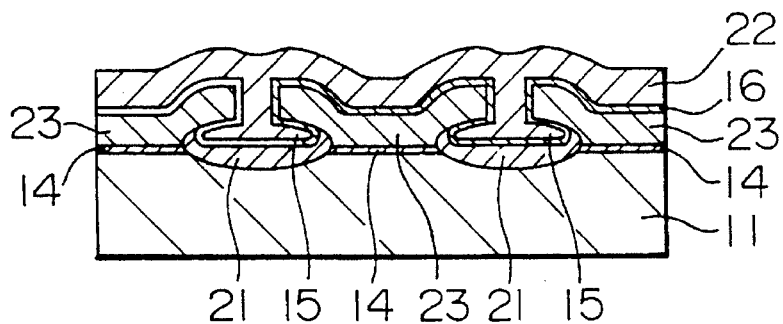

As shown in FIG. 5D, after a conductive polycrystalline silicon film is deposited over the surface of the interlayer insulating film 16 by the CVD method, it is separated by photolithography and dry etching in the direction of IB—IB in FIG. 2 to form the control gate electrodes 22. At the same time, the stripe-like portion 23 and the interlayer insulating film 16 are also separated by etching in the direction of IB—IB to form the individual floating gate electrodes 23.

Next, impurities of phosphorus or arsenic are ion-implanted by using the control gate electrodes 22 as a mask into the substrate at a surface concentration of about $1\times10^{18}$ to $1\times10^{21}$ cm$^{-3}$ to form the N-type drain diffusion layers 12 and source diffusion layers 13. Then, the drain diffusion layers 12 and source diffusion layers 13 are made to overlap with the floating gate electrodes 23 by thermal treatment.

Figure 5E:
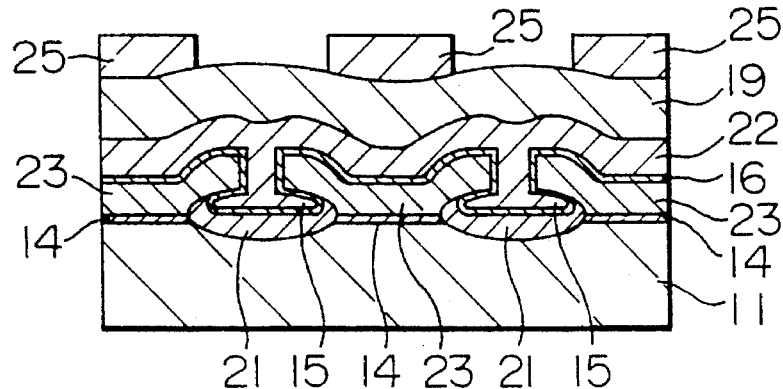

As shown in FIG. 5E, the interlayer insulating film 19, or the silicon oxide film (BPSG film) containing phosphorus and boron is deposited over the control gate electrodes 22. Then, after the contact holes 24 are opened through the interlayer insulating film 19, the metal wiring layers 25 of Al—Si—Cu or other materials are deposited over the interlayer insulating film 19 by sputtering.

Next, a nonvolatile semiconductor memory device according to the second embodiment of the invention will be described with reference to FIGS. 6 and 7.

Figure 6:
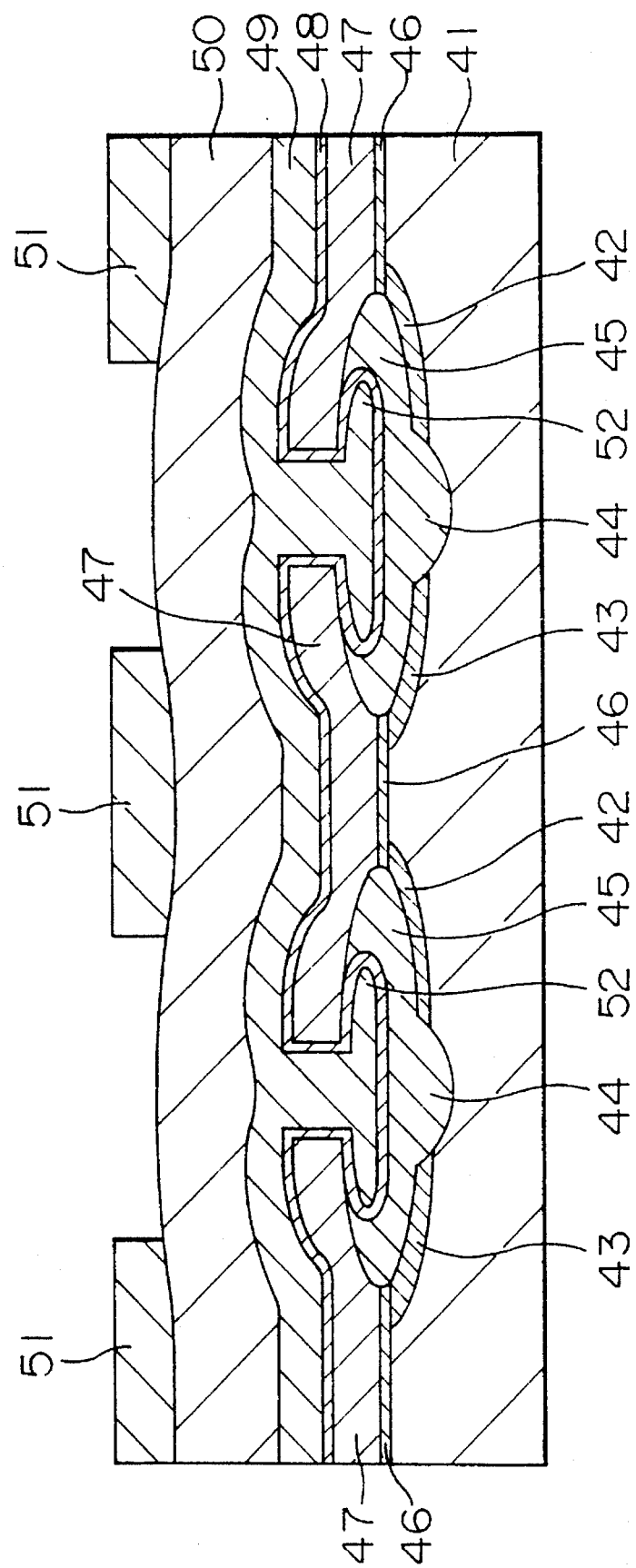
FIG. 6 is a cross-sectional view, corresponding to FIG. 1A, of the memory cells of a nonvolatile semiconductor memory device of the second embodiment according to this invention.
Figure 7:
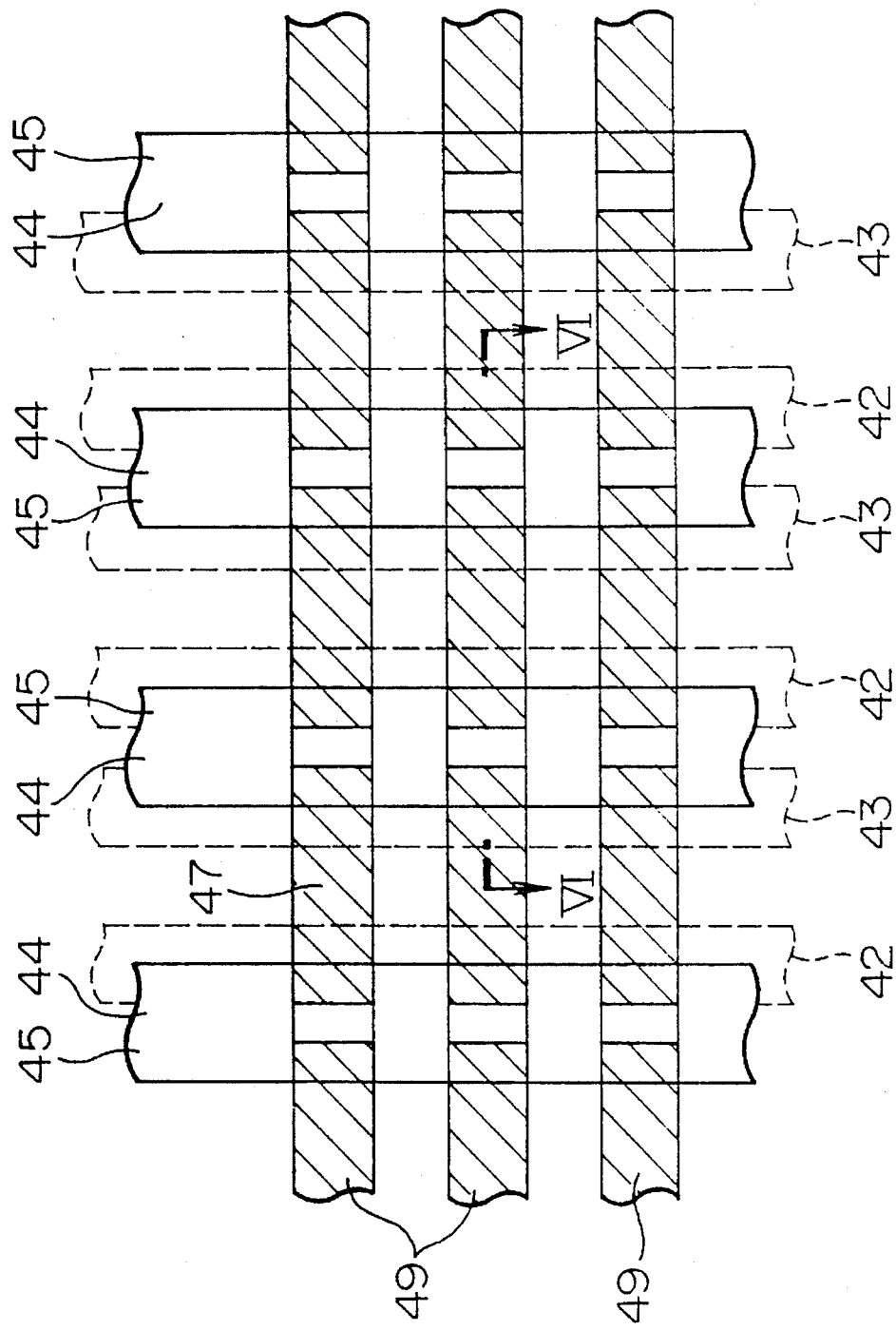
FIG. 7 is a plan view of the memory cell arrangement of the nonvolatile semiconductor memory device of the second embodiment according to this invention.

FIG. 6 is a cross-sectional view taken along a line VI—VI in FIG. 7. FIG. 7 is a plan view of the memory cell arrangement of the second embodiment of the invention.

In FIG. 6, silicon oxide films, or element isolating films 45 are formed at a thickness of for example, about 2000 Å on the P-type silicon substrate 41 by the LOCOS method, and the drain diffusion layer 43 and source diffusion layer 42 are formed under the element isolating films 45 such that each of the drain and source diffusion layers is separated into two parts by a diffusion layer isolating oxide film 44 made of the same material as the element isolation film and having a thickness of about 4000 Å.

The drain diffusion layers 43 and source diffusion layers 42 are formed by doping an impurity material of arsenic into the substrate at a surface concentration of about $1\times10^{18}$ to $1\times10^{21}$ cm$^{-3}$ so as to overlap with the floating gate electrodes 47.

On the channel region separated by the element isolation films 45, a tunnel oxide film 46, or silicon oxide film, is formed at about 50 to 130 Å in thickness by heat oxidization. On the tunnel oxide film 46 is formed a floating gate electrode 47 of conductive polycrystalline silicon film so as to overlap the two adjacent element isolating films 45 formed with gap regions 52.

Moreover, an interlayer insulating film 48, or an ONO insulating film made of for example silicon oxide film/silicon nitride film/silicon oxide film is formed to cover the upper and side surfaces of the floating gate electrode 47 and on the surface of the gap region 52, at about 300 Å in thickness. Also, a control gate electrode 49 of conductive polycrystalline silicon film is deposited to extend on the interlayer insulating film 48 and fill the gap regions 52.

An interlayer insulating film 50 is deposited over the control gate electrode 49 and then the metal wiring layers 51 of Al—Si—Cu are formed on the interlayer insulating film 50.

The operation of the nonvolatile semiconductor memory device according to the second embodiment of the invention will be described with reference to FIG. 8.

Figure 8:
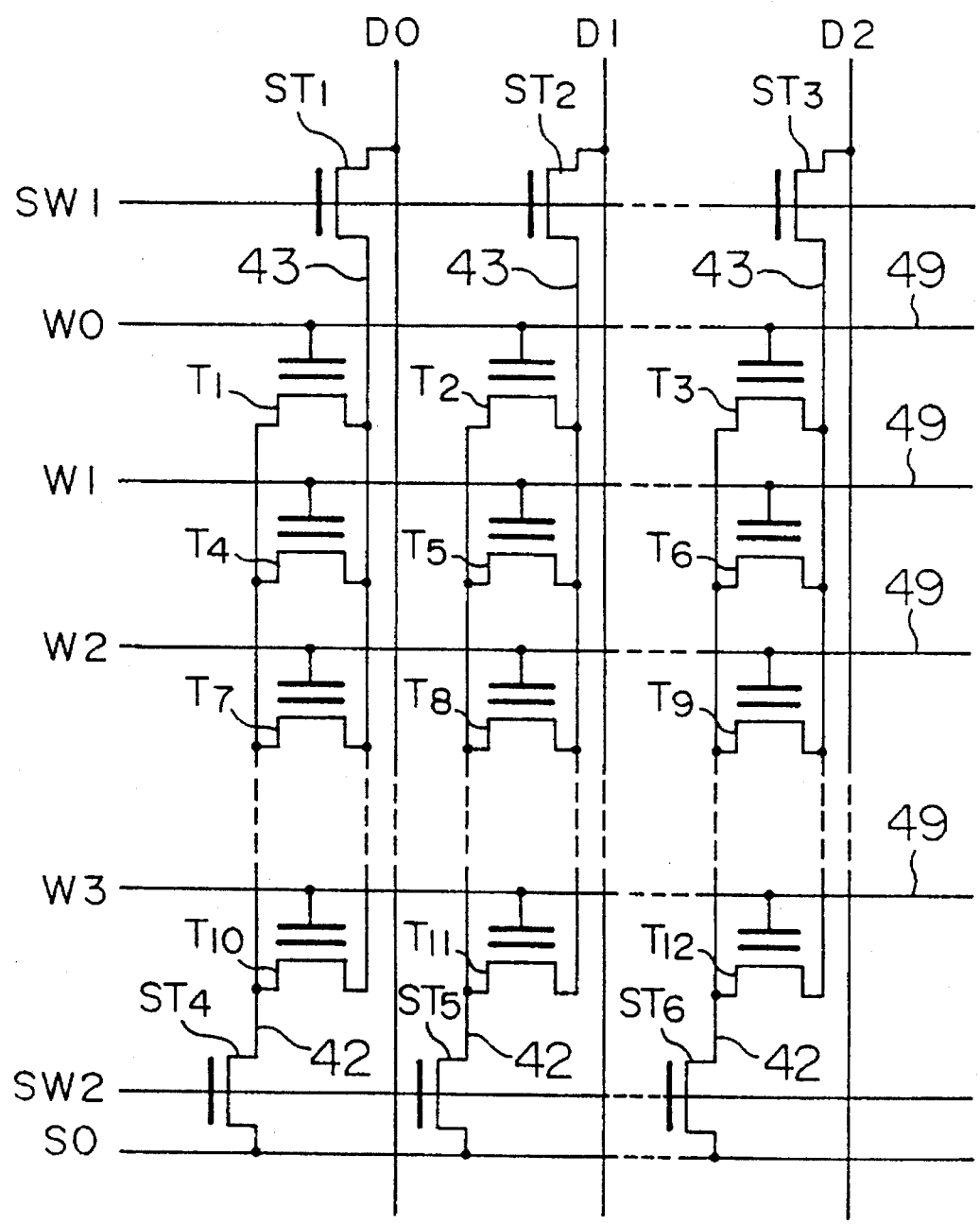
FIG. 8 is a circuit diagram of the nonvolatile semiconductor memory device of the second embodiment according to this invention.

FIG. 8 is an equivalent circuit diagram of the nonvolatile semiconductor memory device according to the second embodiment of the invention.

In the writing mode, when the memory cell transistor T5 is selected, a decoder (not shown) operates to supply for example a voltage of 3 V to the bit line D1, 0 V to the bit lines D0, D2, 0 V to the source line S0, −9 V to the word line W1, 0 V to the word lines W0, W2, W3, 0 V to the substrate 41, 3 V to the selection word line SW1, and 0 V to the selection word line SW2. Consequently, selection transistors ST1, ST3 are turned off, a selection transistor ST2 turned on, and the source diffusion layer 42 of the memory cell transistor T5 is in the floating state. In addition, a voltage of 3 V is applied to its drain diffusion layer 43 (D1), and −9 V to its control gate electrode 49 (W1).

Therefore, the electrons within the floating gate electrode 47 of the selected transistor are pulled out into its drain diffusion layer 43 by FN tunneling, so that the memory cell transistor $T_5$ undergoes writing operation.

In the erasing mode, the decoder (not shown) operates to supply for example a voltage of 0 V to the bit lines D0 to D2, 0 V to the source line S0, 13 V to the word line W1, 0 V to the word lines W0, W2, W3, 0 V to the substrate 41, and 3 V to the selection word lines SW1, SW2. As a result, the selection transistors ST1, ST2, ST3 are turned on, a voltage of 0 V is applied to the drain diffusion layers 43 (D0–D2) and source diffusion layers 42, and 0 V to the control gate electrode 49 (W1).

Therefore, electrons are injected by FN tunneling from the substrate 41 into the memory cell transistors T4 to T6 which are connected to the word line W1, thus performing sector erase operation.

In the reading mode, when the memory cell transistor T5 is selected, the decoder (not shown) operates to supply for example a voltage of 0 V to the bit line D1, 0 V to the bit lines D0, D2, 0 V to the source line S0, 3 V to the word line W1, 0 V to the word lines W0, W2, W3, 0 V to the substrate 41, and 3 V to the selection word lines SW1, SW2. Thus, the selection transistors ST1, ST2, ST3 are turned on, and voltages of 1 V, 0 V and 3 V are applied to the drain diffusion layer 43 (D1), source diffusion layer 42 and control gate electrode 49 (W1) of the memory cell transistor T5, respectively. A sense amplifier (not shown) detects if a current flows through the memory cell transistor T5.

In this second embodiment, if the area of the memory cell is made equal to that in the prior art, the voltage to be applied to the control gate electrode 49 in the writing mode can be reduced, and thus low voltages can be used for operation.

Moreover, if the voltages to be applied in the writing mode are made equal to those in the prior art and the value of the capacitance $C_{FC}$ between the control gate electrode 49 and the floating gate electrode 47 is the same as in the prior art, the area of the memory cell can be decreased because an amount of the overlap between the element isolating film 45 and the floating gate electrode 47 can be reduced.

According to this invention, since the control gate electrode is formed to extend the undersides of the floating gate electrode with an insulating film therebetween, the capacitance coupling ratio can be increased without increasing the area of the memory cell, and hence it is possible to make the memory cell operating voltage lower and the operating speed higher.

Furthermore, since the element isolation insulating films are etched by using as a mask the first polycrystalline silicon films of the floating gate electrodes to form the cavities or gap regions in the element isolation insulating films, and since the second polycrystalline silicon films of the control gate electrodes are formed to fill the cavities covered by the interlayer insulating films, the number of steps in the production of the memory cells is almost not increased and hence the throughput and yield are not reduced.

What is claimed is:

1. A nonvolatile semiconductor memory device comprising:

a semiconductor substrate of a first conductivity type;

at least a pair of element isolation insulating films;

a pair of spaced source/drawn regions of a second conductivity type different from said first conductivity type and formed in a surface of said semiconductor substrate;

a floating gate electrode formed above a channel region disposed between said pair of source/drain regions in the surface of said semiconductor substrate in an insulated relationship with said channel region, wherein said floating gate electrode overlaps each of said element isolation insulating films and a gap is formed between an underside of said floating gate electrode and each of said element isolation insulating films at each of portions thereof where said floating gate electrode overlaps said pair of element isolation insulating films, respectively; and a control gate electrode formed above said floating gate electrode in an insulated relationship with said floating gate electrode, wherein a part of said control gate electrode extends beyond a side of said floating gate electrode to an underside of said floating gate electrode facing each of the gaps.

2. A nonvolatile semiconductor memory device comprising:

a semiconductor substrate;

at least a pair of element isolation insulating films formed in a surface of said semiconductor substrate;

a floating gate electrode formed above the surface of said substrate at a portion between said pair of element isolation insulating films in an insulated relationship with said substrate and overlapping with each of said element isolation insulating films;

a gap formed at an overlapped portion between said floating gate electrode and each of said element isolation insulating film; and a control gate electrode formed above said floating gate electrode in an insulated relationship with said floating gate electrode, a part of said control gate electrode extending beyond a side of said floating gate electrode into said gap.

3. A nonvolatile semiconductor memory device according to claim 1, wherein a maximum distance between said floating gate electrode and each of said element isolation insulating films across the associated gap is at least 0.1 μm and a depth of each gap is at least 0.2 μm.

4. A nonvolatile semiconductor memory device comprising:

a semiconductor substrate of a first conductivity type;

at least a pair of element isolation insulating films;

a pair of spaced source/drain regions of a second conductivity type different from said first conductivity type and formed in a surface of said semiconductor substrate;

a floating gate electrode formed above a channel region disposed between said pair of source/drain regions in the surface of said semiconductor substrate in an insulated relationship with said channel region, wherein said floating gate electrode overlaps at least one of said element isolation insulating films, a gap is formed between an underside of said floating gate electrode and said one element isolation insulating film at a portion where said floating gate electrode overlaps said at least one of said element isolation insulating films; and a control gate electrode formed above said floating gate electrode in an insulated relationship with said floating gate electrode, wherein a part of said control gate electrode extends beyond a side of said floating gate electrode to an underside of said floating gate electrode facing said gap.

5. A nonvolatile semiconductor memory device comprising:

a semiconductor substrate of a first conductivity type;

a plurality of spaced element isolation insulating films formed in a surface of said semiconductor substrate, each of said element isolation insulating films having a source/drain isolation insulating film formed at its underside;

a pair of source/drain regions of a second conductivity type different from said first conductivity type and formed at both sides of each of said element isolation insulating films so that spaced source/drain regions are formed in a space between adjacent two of said element isolation insulating films, said source/drain regions formed at both sides of each of said element isolation insulating films being isolated from each other by the source/drain isolation insulating film formed at the underside of said element isolation insulating film; and a gate electrode structure formed above a channel region defined between an adjacent two of said element isolation insulating films, said gate electrode structure constituting a memory cell together with the source/drain regions formed in said space between said adjacent two element isolation insulating films, wherein said gate electrode structure includes a floating gate electrode formed above said channel region and a control gate electrode formed above said floating gate electrode in an insulated relationship with said floating gate electrode and wherein a part of said control gate electrode extends beyond a side of said floating gate electrode to an underside of said floating gate electrode.

6. A nonvolatile semiconductor memory device according to claim 5, wherein said floating gate electrode overlaps at least one of said adjacent two element isolation insulating films so as to form a gap between an underside of said floating gate electrode and said at least one element isolation insulating film so that said part of said control gate electrode extends to the underside of said floating gate electrode facing said gap.

7. A nonvolatile semiconductor memory device according to claim 5, wherein said source/drain isolation insulating film is made of the same material as that of said element isolation insulating film.

8. A nonvolatile semiconductor memory device comprising:

a semiconductor substrate of a first conductivity type;

a plurality of spaced element isolation insulating films formed in a surface of said semiconductor substrate, each of said element isolation insulating films having a source/drain isolation insulating film formed at its underside;

a pair of source/drain regions of a second conductivity type different from said first conductivity type and formed at both sides of each of said element isolation insulating films so that spaced source/drain regions are formed in a space between adjacent two of said element isolation insulating films, said source/drain regions formed at both sides of each of said element isolation insulating films being isolated from each other by the source/drain isolation insulating film formed at the underside of said element isolation insulating film;

a floating gate electrode formed above the surface of said substrate at said space between adjacent two of said element isolation insulating films in an insulated relationship with said substrate and overlapping each of said adjacent two element isolation insulating films with a gap formed therebetween; and a control gate electrode formed above said floating gate electrode in an insulated relationship with said floating gate electrode, a part of said control gate electrode extending beyond a side of said floating gate electrode into said gap, wherein said control gate electrode and the associated floating gate electrode constitute a memory cell together with said source/drain regions formed in said space between said adjacent two element isolation insulating films.

9. A nonvolatile semiconductor memory device according to claim 8, wherein said source/drain isolation insulating film is made of the same material as that of said element isolation insulating film.

10. A nonvolatile semiconductor memory device comprising:

a semiconductor substrate of a first conductivity type;

a pair of spaced source/drain regions of a second conductivity type different from said first conductivity type and formed in a surface of said semiconductor substrate;

a floating gate electrode formed above a channel region disposed between said pair of source/drain regions in the surface of said semiconductor substrate in an insulated relationship with said channel region;

a control gate electrode formed above said floating gate electrode in an insulated relationship with said floating gate electrode, wherein a part of said control gate electrode extends beyond a side of said floating gate electrode to an underside of said floating gate electrode;

at least a pair of element isolation insulating films formed in the surface of said semiconductor substrate, said floating gate electrode being formed to overlap at least one of said pair of element isolation insulating films, a gap being formed between an underside of said floating gate electrode and said one element isolation insulating film at a portion where said floating gate electrode overlaps said one element isolation insulating film, said part of said control gate electrode extending to the underside of said floating gate electrode facing said gap; and wherein a maximum distance between said floating gate electrode and said element isolation insulating film across said gap is at least 0.1 µm and a depth of said gap is at least 0.2 µm.

11. A nonvolatile semiconductor memory device comprising:

a semiconductor substrate;

at least a pair of element isolation insulating films formed in a surface of said semiconductor substrate;

a floating gate electrode formed above the surface of said substrate at a portion between said pair of element isolation insulating films in an insulated relationship with said substrate and overlapping with each of said element isolation insulating films;

a gap formed at an overlapped portion between said floating gate electrode and each of said element isolation insulating film;

a control gate electrode formed above said floating gate electrode in an insulated relationship with said floating gate electrode, a part of said floating gate electrode extending beyond a side of said floating gate electrode into said gap; and wherein a maximum distance between said floating gate electrode and said element isolation insulating film across said gap is at least 0.1 µm and a depth of said gap is at least 0.2 µm.

* * * * *